United States Patent [19]

Saha

[11] Patent Number: 4,559,491

[45] Date of Patent: Dec. 17, 1985

[54] METHOD AND DEVICE FOR LOCATING A FAULT POINT ON A THREE-PHASE POWER TRANSMISSION LINE

[75] Inventor: Murari M. Saha, Västerås, Sweden

[73] Assignee: ASEA Aktiebolag, Västerås, Sweden

[21] Appl. No.: 528,196

[22] Filed: Aug. 31, 1983

[30] Foreign Application Priority Data

Sep. 14, 1982 [SE] Sweden ............................ 8205235

[51] Int. Cl.$^4$ .......................................... G01R 31/08
[52] U.S. Cl. .................................... 324/52; 364/492
[58] Field of Search ................ 324/52; 364/492, 483

[56] References Cited

U.S. PATENT DOCUMENTS 3,593,124 7/1971 Cahen et al. ......................... 324/52
4,313,169 1/1982 Takagi et al. ...................... 364/492

FOREIGN PATENT DOCUMENTS 26465 2/1980 Japan .
0066768 5/1980 Japan ................................... 324/52
0116278 9/1980 Japan ................................... 324/52
2036478A 6/1980 United Kingdom ................. 324/52
0208121 3/1968 U.S.S.R. .............................. 324/52

OTHER PUBLICATIONS

Pratesi et al., Fault Locators for Overhead Lines, Electra, No. 34, pp. 211–217.
Paithankar et al., On-Line Digital Fault-Locator for Overhead Transmission Line, May 1978, pp. 1–6, IEEE.
Saha et al., An Accurate Fault Locator with Compensation for Apparent Reactance in the Fault Resistance Resulting from Remote-End Infeed, Feb. 1985, IEEE Transactions on Power Apparatus and Systems, vol. PAS-104, No. 2, pp. 424–436.
Hagenmeyer et al., Decentralized Fault Location Combined with Centralized Computer Evaluation in a Main Control Centre Gives Optimized Network Operation, 9-1982, pp. 1–8.
Bibliography and Summary of Fault Location Methods, AIEE Committee Report, Feb. 1956.

Godard, Electrical Utility Load Forecasting, Feb. 1956, AIEE, p. 1428.
Stevens et al., Frequency Modulated Fault Locator for Power Lines, Dec. 1971, pp. 1760–1768.
Humpage et al., Measuring Accuracy of Distance Protection with Particular Reference to Earth-Fault Conditions on 400 KV Looped-Circuit Interconnections, Proc. IEE, vol. 117, No. 2, Feb. 1970, pp. 431–438.
Saha et al., Microprocessor-Based Accurate Fault Locator with Remote-End Infeed Compensation, IEE Third International Conference on Developement of Power System Protection, Apr. 1985, pp. 193–198.
Stringfield et al., Fault Location Method for Overhead Lines, AIEE, Aug. 1957, pp. 518–528.

Primary Examiner—Stanley T. Krawczewicz
Assistant Examiner—Jack B. Harvey
Attorney, Agent, or Firm—Pollock, Vande Sande & Priddy

[57] ABSTRACT

A fault point in a line section of a three-phase power transmission line, is determined by measuring currents and voltages at a measuring point arranged adjacent the near end of the section. The type of fault (single-phase/multi-phase ground fault/phase-to-phase fault) is determined and the parameters in a quadratic equation are determined using the relative distance (n) from the measuring point to the fault point as a variable. The equation is derived in advance from the electrical relationships between the complex values of the line impedance, the source impedances of the networks located ahead of and behind the fault, and measured currents and voltages following elimination of the fault resistance and possible zero sequence components. The parameters in the equation are determined by the type of the fault, by the measured voltages and currents and by said impedances. The equation is solved directly by means of a numerical square root method. When calculating the parameters, the fundamental frequency components of the measured values are used, which components are obtained by digital filtering of the measured values.

8 Claims, 10 Drawing Figures

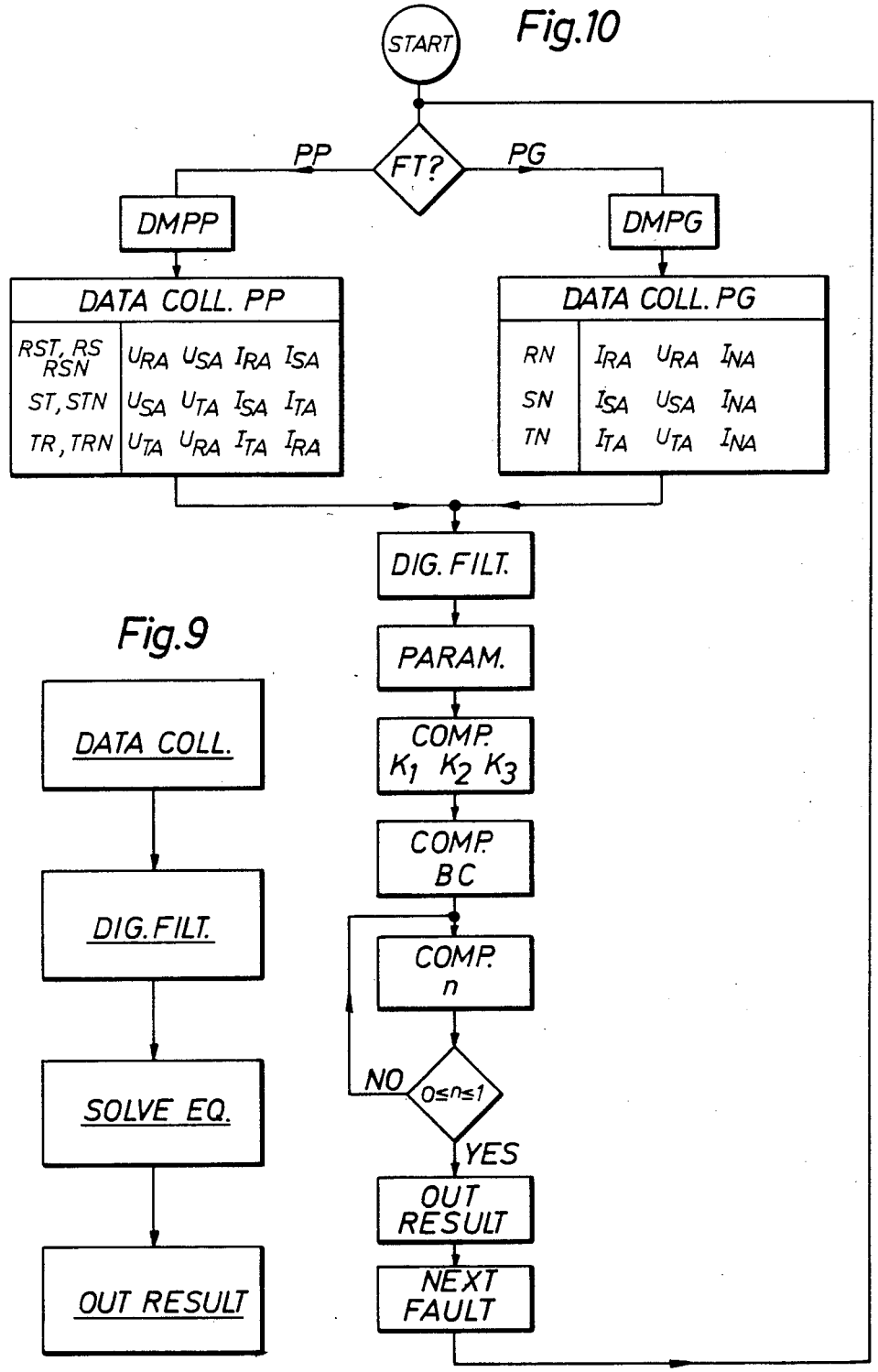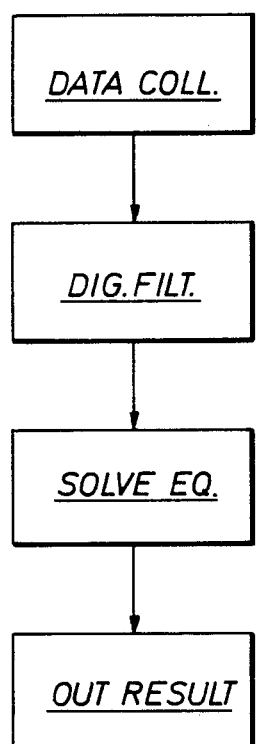

METHOD AND DEVICE FOR LOCATING A FAULT POINT ON A THREE-PHASE POWER TRANSMISSION LINE

TECHNICAL FIELD

The present invention relates to a method and device for locating a fault point within a given section of a three-phase power transmission line, which given section is positioned between a network located behind and a network located ahead of the given section. Currents and voltages in the line, are measured at a measuring point arranged at one end point of the given section. By using the measured values and the known parameters of the given line section, the distance between the measuring point and the fault point is calculated.

DISCUSSION OF PRIOR ART

A fault-locating method of the above kind is previously known from British Patent Specification No. 2,036,478. In this a method is described wherein a fault point is assumed and, under simplified assumptions about the parameters of the network, the current and voltage at the fault point are calculated. If this current and this voltage are not in phase with each other, a new fault point is assumed, and the calculation is repeated until phase correspondence exists. The last assumed fault point is then taken to be the real fault point. In a described variant of this method, the distribution factors for the parts of the network, located on either side of the fault point, are assumed to have the same arguments, or else it is assumed that the difference between the arguments is known and constant along the line segment in question. It has proved that this simplified assumption gives rise to large errors in the calculated fault distance. The difference between the two arguments mentioned varies with the distance to the fault, and also small changes or inaccuracies of this difference greatly influence the calculated fault distance.

In another variant described in the said British patent specification, certain initial values, both for said argument difference and for the fault distance, are assumed, whereafter the current and voltage at the fault point are determined. If these two quantities are not in phase, new values of the argument difference and the fault distance are assumed. This procedure is repeated until the fault current and the fault voltage are in phase. The last assumed value of the fault distance is assumed to be the correct value. However, it has proved that small changes in the assumed value of the argument difference result in great changes of the calculated fault distance and that, therefore, this method in many cases gives completely incorrect values, or that it does not at all provide convergence towards a determined fault distance.

British Patent Specification No. 2036478 describes the method applied to a single-phase network and only indicates the possibility of using it in a three-phase network. However, it has been found that the above-mentioned disadvantages of the described method are particularly great in connection with three-phase networks, and in fact they are so great that the method described in this specification probably cannot be employed at all with a three-phase network.

A further disadvantage with this known method is that the iterative methods of calculation require a considerable time to effect and/or take up considerable calculating capacity.

One object of this invention is to provide a method for locating a fault on a three-phase power transmission line, which provides an accurate, fast and reliable determination of the distance of the fault from a measuring point.

A further object of the invention is to provide a device for carrying out the method.

BRIEF STATEMENT OF THE INVENTION

In its broadest aspect the present invention relates to a method for locating a fault point within a section of a three-phase power transmission line located between a network positioned behind and a network positioned ahead of said section. Currents and voltages in the line are measured at a measuring point arranged at one end of the section. With the aid of the measured values and the parameters of the line section, the distance between the measuring point and the fault point is computed. The method is characterized in that the type of the fault is determined. The measured values are filtered for formation of their fundamental frequency components. Guided by the type of fault and by the complex values of the fundamental frequency components of the measured values, the impedance of the line section as well as the pre-set or calculated values of the impedances of the networks lying ahead of and behind the fault distance (n) is determined as the solution of an equation $$n^2 + B \times n + C = 0$$

which contains the fault distance (n) as a variable, the parameters (B, C) of which are dependent on the fundamental frequency components of the measured values and on said impedances and which has been formed under elimination of the fault resistance and of possible zero sequence components.

BRIEF DESCRIPTION OF THE DRAWINGS

The invention will now be further described, by way of example, with reference to the accompanying drawings, in which FIG. 9 shows an explanatory diagram of the working procedure of the microprocessor in a fault locator, and FIG. 10 shows in more detail in the form of a flow chart, the mode of operation of the fault locator.

DESCRIPTION OF PREFERRED EMBODIMENTS

Figure 1:
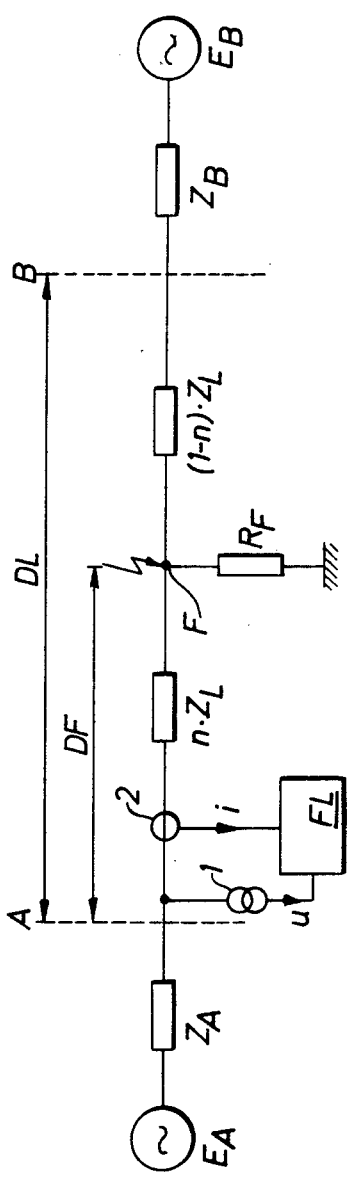
FIG. 1 shows the principle behind the operation of a fault locator disposed at one end of a line section.

FIG. 1 shows a one-line diagram of a line section of a three-phase power system. The section has a length of DL between its end points A and B. A fault locator FL is arranged adjacent to the end point A and is connected to the line via voltage and current transformers 1 and 2 which feed measuring signals u and i to the fault locator proportional to the voltages and currents at the point A. The line section has an impedance $Z_L$. A fault of arbitrary type is assumed to have occurred at a point F at the (as yet unknown) distance DF from the end point A. If $n=DF/DL$, the line impedance between the points A and F is $n \times Z_L$ and between the points F and B $(1-n) \times Z_L$. The network located "behind" (i.e. to the left of) end point A has a source electromotive force (EMF) $E_A$ and an impedance $Z_A$. The network located "ahead of" (i.e. to the right of) the end point B has a source EMF $E_B$ and an impedance $Z_B$.

Now $Z_L$ is a known parameter. $Z_A$ may be known, but if not, may be calculated from measured values of currents and voltages taken at the end point A before and after a fault. $Z_B$ may be a known parameter, but if not, should be estimatable with an acceptable degree of accuracy so that its value can be set in the fault locator FL.

When a fault has occurred, the fault locator starts and estimates, from measured values of currents and voltages at the end point A before and after the fault and from pre-set or calculated values of the parameters $Z_A$, $Z_B$, $Z_L$, the unknown distance DF (or the ratio n which gives the relative distance) from the end point A to the fault point F.

The mathematical background of the relationships used by the fault locator to determine the fault distance will now be described.

Figure 2:
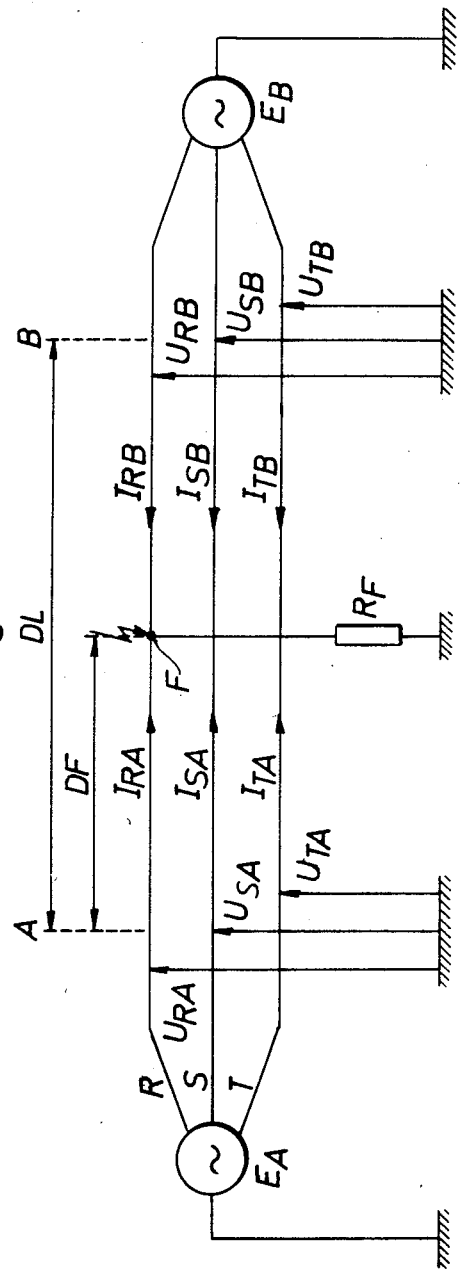
FIG. 2 shows the designations used for certain quantities.
Figure 3:
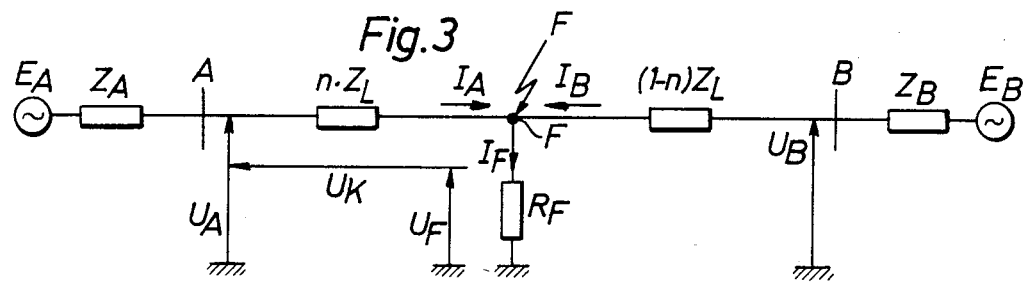
FIG. 3 shows the conditions arising in the case of a fault.
Figure 4:
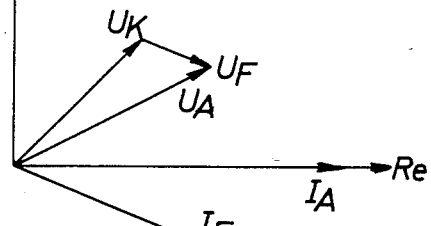
FIG. 4 shows a vector diagram of the quantities in FIG. 3.

FIGS. 2 and 3 show the designations used for the various currents and voltages (see also Table 1). FIG. 4 shows in vector form an example of the quantities indicated in FIG. 3.

Starting from the end point A, an equation with complex quantities is set up, which indicates the relationship between the measured voltage and current components, which have the same frequency as the operating frequency of the network, and the network impedances. Since the load current is measured before the occurrence of a fault, the effect of any input from the remote network $E_B$, $Z_B$ to the fault point can be ignored.

The equation can generally be expressed as follows (see FIG. 3)

$$U_A = I_A \times Z_L + I_F \times R_F \quad (1)$$

or $$U_A = U_K + U_F \quad (2)$$

where the values of $U_A$, $I_A$ and $I_F$ are dependent on the type of fault which has arisen. Two types of fault may occur, namely, single-phase faults (i.e. single-phase ground faults) and multi-phase faults (i.e. faults between two or more phases and two-phase or three-phase ground faults). The following analysis shows how $U_A$, $I_A$ and $I_F$ are derived for each of the two different types of fault.

A. Single-phase fault

In this analysis the three possible single-phase faults are designated RN, SN and TN depending on whether it is the R, S or T phase which has faulted to ground. A fault type RN (ground fault in phase R) is assumed to have occurred and is illustrated in FIG. 2. From FIG. 2 the following is obtained $$U_{RA} = (I_{RA} + KNL \times I_{NA}) \times n \times Z_L + I_F \times R_F \quad (3)$$

where KNL is the zero sequence compensation and is equal to $(Z_{0L} - Z_L)/3 Z_L$ and the current at the fault point is $$I_F = I_{RA} + I_{RB}.$$

The phase current change at point A due to the fault is $$\Delta I_{RA} I_{RA} - I_{RA}° \quad (4)$$

where $I_{RA}$ is the measured post-fault phase current at A and $I_{RA}°$ is the measured phase current at A before the fault (pre-fault).

Further, $$\Delta I_{RA} = I_{1A} + I_{2A} + I_{0A} \quad (5)$$

where $I_{1A}$, $I_{2A}$ and $I_{0A}$ are the symmetrical components (i.e. respectively the positive sequence, negative sequence and zero sequence currents) of $\Delta I_{RA}$.

Figure 5:
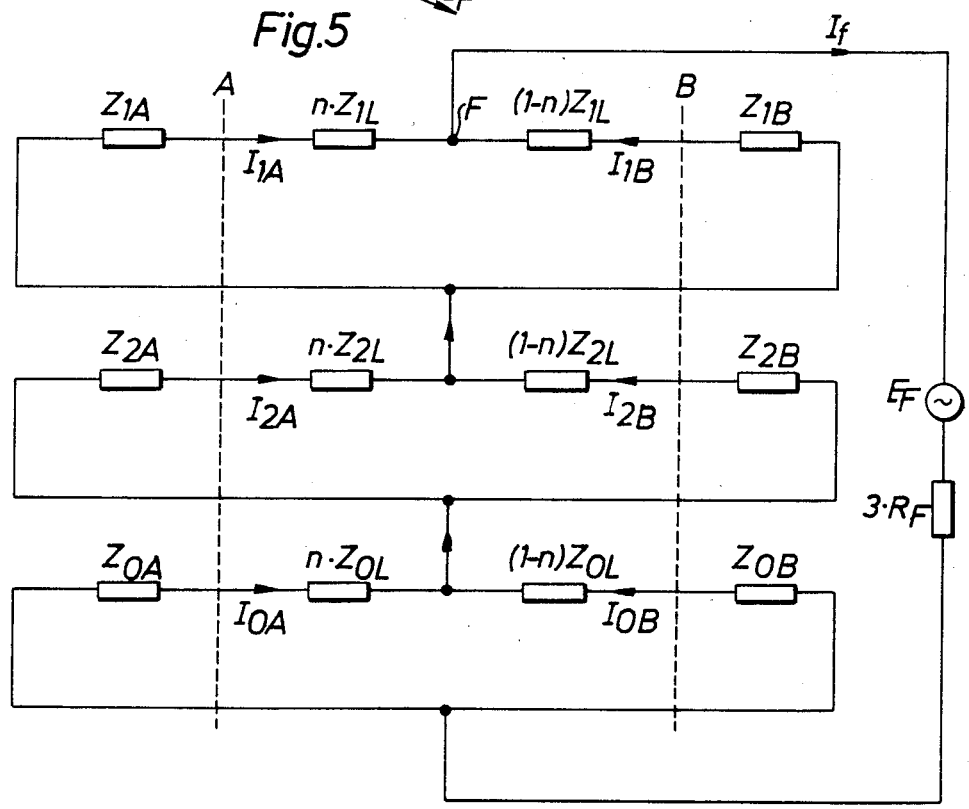
FIG. 5 shows the interconnection of the positive sequence, negative sequence and zero sequence networks in the case of a single-phase ground fault.

FIG. 5 shows how, in a manner known per se, the impedance networks of the three components are connected together. The following relationships are valid $$\Delta I_{RA} = (D_{1A} + D_{2A} + D_{0A}) \times I_f \quad (6)$$

where $$D_{1A} = \frac{(1-n) \times Z_{1L} + Z_{1B}}{Z_{1A} + Z_{1L} + Z_{1B}}$$

with corresponding relationships for the other distribution factors $D_{2A}$ and $D_{0A}$ and $I_f = I_F/3$.

From FIG. 5 there is obtained $$I_f = I_{0A} + I_{0B} = I_{0A}\left(1 + \frac{I_{0B}}{I_{0A}}\right) = I_{0A}\left(1 + \frac{D_{0B}}{D_{0A}}\right)$$

which gives $$I_f = I_{0A}/D_{0A} \quad (7)$$

since $D_{0A} + D_{0B} = 1$.

From equation (7) there is obtained $$I_{NA} + I_{NB} = 3(I_{0A} + I_{0B}) = 3 \times I_f = 3 \times \frac{I_{0A}}{D_{0A}} \quad (8)$$

where $I_{NA}$ and $I_{NB}$ are the neutral currents at the end points A and B, respectively.

From equations (6) and (7) there is obtained $$\Delta I_{RA} = (D_{1A} + D_{2A} + D_{0A}) \times I_f = (D_{1A} + D_{2A} + D_{0A}) \times \quad (9)$$

-continued $$\frac{I_{OA}}{D_{OA}} = (D_{1A} + D_{2A} + D_{OA}) \times \frac{I_{NA}}{3 \times D_{OA}}$$

where $I_{NA} = 3 \times I_{0A}$.

From equation (9) there is obtained $$\frac{I_{NA}}{D_{OA}} = \frac{3 \times \Delta I_{RA} - I_{NA}}{D_{1A} + D_{2A}} \qquad (10)$$

In the case of a single-phase ground fault, the accuracy of calculation can be considerably increased by eliminating the uncertain zero sequence quantities, so that the calculation can be carried out with the aid of the better defined positive sequence quantities of the network.

From equations (3) and (8) there is obtained $$I_F = 3 \times I_f = I_{RA} + I_{RB} = I_{NA} + I_{NB} = \frac{I_{NA}}{D_{OA}} \qquad (11)$$

Equations (10) and (11) give $$I_F = \frac{3 \times \Delta I_{RA} - I_{NA}}{D_{1A} + D_{2A}} \qquad (12)$$

The distribution factors for the positive sequence and negative sequence currents may be assumed, with great accuracy, to be equal, that is, $$D_{1A} = D_{2A} = \frac{(1-n)Z_L + Z_B}{Z_A + Z_L + Z_B} \qquad (13)$$

Equations (12) and (13) give an expression for $I_F$ expressed in measurable quantities:

$$I_F = \frac{I_{FA}}{D_{1A}} \qquad (14)$$

where $I_{FA} = 3/2 \times (\Delta I_{RA} - I_{0A})$ and $I_{0A} = I_{NA}/3$

From equations (3) and (14) there is obtained $$U_{RA} = (I_{RA} + KNL \times I_{NA}) \times n \times Z_L + \frac{3}{2} \times \frac{(\Delta I_{RA} - I_{0A})}{D_{1A}} \times R_F \qquad (15)$$

This expression may be rewritten in a general form:

$$U_A = I_A \times n \times Z_L + I_{FA} \times \frac{R_F}{D_{1A}} \qquad (16)$$

where $U_A = U_{RA}$ $I_A = I_{RA} + KNL \times I_{NA}$ $$I_{FA} = \frac{3}{2}(\Delta I_{RA} - I_{0A}) = \frac{3}{2}\left(\Delta I_{RA} - \frac{I_{NA}}{3}\right)$$

Equation (16) is the general form of the fault location equation (cf. equation (1)) where the values of $U_A$, $I_A$ and $I_{FA}$ are different for each fault type. These values are clear from Table 2 for the three single-phase types of fault RN, SN and TN.

B. Multi-phase faults

These types of fault are designated in the following analysis as RS, ST, TR (the three possible phase-to-phase faults), RST (the three-phase fault) and RSN, STN and TRN (the three possible two-phase-to-ground faults). A phase-to-phase fault between phase R and phase S is assumed to have occurred. For multi-phase faults, the difference of phase voltages and currents between the said phases is used in the calculation.

From FIG. 2 there is obtained $$U_{RA} - U_{SA} = (I_{RA} - I_{SA}) \times n \times Z_L + \qquad (17)$$
$$[(I_{RA} - I_{SA}) + (I_{RB} - I_{SB})] \times R_F$$

that is, $$U_{RSA} = I_{RSA} \times n \times Z_L + (I_{RSA} + I_{RSB}) \times R_F \qquad (18)$$

with designations according to Table 1.

Figure 6:
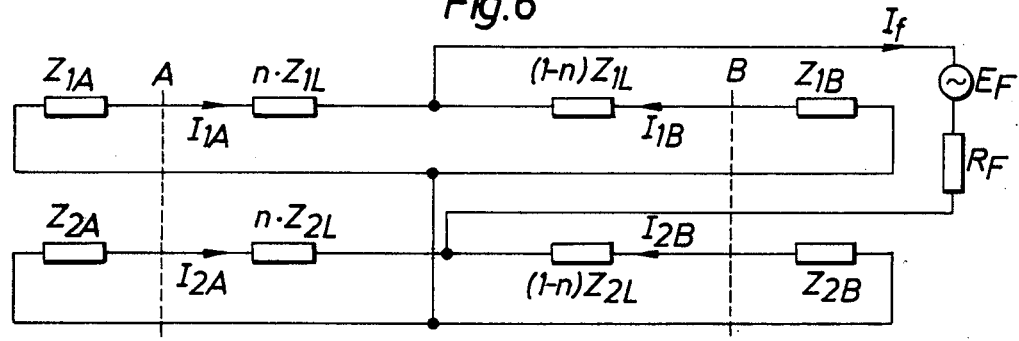
FIG. 6 shows the interconnection of the positive sequence and negative sequence networks in the case of a phase-to-phase fault.

FIG. 6 shows the interconnection of the positive sequence and negative sequence networks in the case of this type of fault.

With reference to FIG. 6, the following expression can be formed $$I_{RA} = (a^2 \times I_{1A} + a \times I_{2A} + a^2 \times I_b) \times a = I_{1A} + a^2 \times I_{2A} + I_b$$

that is, $$I_{RA} = I_{1A} + a^2 \times I_{2A} + I_{RA}^\circ \qquad (19)$$

where $I_{1A}$ is the positive sequence current at the end point A, $I_{2A}$ is the negative sequence current at the end point A, $I_b = I_{RA}^\circ$ is the R phase current at the end point A measured before the fault occurred, $$a = -\tfrac{1}{2} + j \times \frac{\sqrt{3}}{2}, \text{ and}$$

$$a^2 = -\tfrac{1}{2} - j \times \frac{\sqrt{3}}{2}$$

From equation (19) the following expression is obtained $$\Delta I_{RA} = I_{RA} - I_{RA}^\circ = I_{1A} + a^2 \times I_{2A} \qquad (20)$$

The distribution factors for the positive sequence and negative sequence networks may with good accuracy be set equal, that is, $$D_{1A} = D_{2A} = \frac{(1-n) \times Z_L + Z_B}{Z_A + Z_L + Z_B}$$

and thus:

$$I_{1A} = -I_{2A} \qquad (21)$$

From equations (20) and (21) the following expression is obtained $$\Delta I_{RA} = I_{RA} - I_{RA}^\circ = I_{1A}(1-a^2) \quad (22)$$

In the same way the following is obtained $$I_{SA} = (a \times I_{1A} + a^2 \times I_{2A} + a \times I_b) \times a = a^2 \times I_{1A} + I_{2A} + + a^2 \times I_b$$

that is, $$I_{SA} = a^2 \times I_{1A} + I_{2A} + I_{SA}^\circ \quad (23)$$

where $$I_{SA}^\circ = a^2 \times I_{RA}^\circ$$

From equations (21) and (23) the following is obtained $$\Delta I_{SA} = I_{SA} - I_{SA}^\circ = a^2 \times I_{1A} + I_{2A} = I_{1A}(a^2-1) \quad (24)$$

Equations (22) and (24) give $$\Delta I_{RSA} = \Delta I_{RA} - \Delta I_{SA} = I_{1A}(1-a^2-a^2+1)$$

that is, $$\Delta I_{RSA} = 2 \times I_{1A}(1-a^2) \quad (25)$$

Further, the following equation is valid (FIG. 6)

$$I_{1A} = D_{1A} \times I_f \quad (26)$$

which together with equation (25) gives $$\Delta I_{RSA} = 2 \times D_{1A} \times I_f(1-a^2) \quad (27)$$

From equations (19) and (23) the following is obtained $$I_{RA} - I_{SA} = 2 \times (1-a^2) \times I_{1A} + I_b(1-a^2) \quad (28)$$

In the same way the following expression is obtained for the difference current between phase R and phase S at the end point B:

$$I_{RB} - I_{SB} = 2 \times (1-a^2) \times I_{1B} - I_b(1-a^2) \quad (29)$$

which with equation (28) gives $$(I_{RA} - I_{SA}) + (I_{RB} - I_{SB}) = 2 \times (1-a^2)(I_{1A} + I_{1B}) \quad (30)$$

Further, the following equation is valid (FIG. 6)

$$I_{1B} = D_{1B} \times I_f \quad (31)$$

where $$D_{1B} = \frac{n \times Z_L + Z_A}{Z_A + Z_L + Z_B}$$

and $$D_{1A} + D_{1B} = 1 \quad (32)$$

From equations (26), (30), (31) and (32) the following is obtained $$(I_{RA} - I_{SB}) + (I_{RB} - I_{SB}) = 2 \times (1-a^2) \times I_f \quad (33)$$

Equation (27) may be written $$I_f = \frac{\Delta I_{RSA}}{2 \times D_{1A}(1-a^2)} \quad (34)$$

which with equation (33) gives $$(I_{RA} - I_{SA}) + (I_{RB} - I_{SB}) = \frac{\Delta I_{RSA}}{D_{1A}} \quad (35)$$

In the same way as for single-phase faults, the fault current $I_F$ is expressed in measurable quantities:

$$I_F = I_{RSA} + I_{RSB} = \frac{I_{FA}}{D_{1A}} \quad (36)$$

where $I_{FA}$ is the current change, caused by the fault, at the end point A and has the value $$I_{FA} = \Delta I_{RSA}$$

Equations (18) and (36) give $$U_{RSA} = I_{RSA} \times n \times Z_L + \Delta I_{RSA} \times \frac{R_F}{D_{1A}} \quad (37)$$

In the same way as for single-phase faults (see equation 16), equation (37) may be rewritten in general form:

$$U_A = I_A \times n \times Z_L + I_{FA} \times \frac{R_F}{D_{1A}} \quad (38)$$

where $$U_A = U_{RSA} = U_{RA} - U_{SA}$$

$$I_A = I_{RSA} = I_{RA} - I_{SA}$$

$$I_{FA} = \Delta I_{RSA} = I_{RSA} - I_{RSA}^\circ = (I_{RA} - I_{RA}^\circ) - (I_{SA} - I_{SA}^\circ)$$

Equation (38), as well as equation (16), is the general form of the fault location equation, where the values for $U_A$, $I_A$ and $I_{FA}$ are different for each type of fault. These values will be clear from Table 2 for the multi-phase fault types RS, ST, TR, RSN, STN, TRN and RST.

C. Solution of the fault location equation

As mentioned above, the equation (which has complex variables and parameters) has the form $$U_A = I_A \times n \times Z_L + I_{FA} \times \frac{R_F}{D_{1A}} \quad (39)$$

Since $D_{1A}$ (equation 13) is a linear function of n, equation (39) will be non-linear and may be written as follows:

$$n^2 - n \times K_1 + K_2 - K_3 \times R_F = 0 \quad (40)$$

where $$K_1 = \frac{U_A}{I_A \times Z_L} + 1 + \frac{Z_B}{Z_L}$$

$$K_2 = \frac{U_A}{I_A \times Z_L}\left(\frac{Z_B}{Z_L} + 1\right) \quad (41)$$

$$K_3 = \frac{I_{FA}}{I_A \times Z_L}\left[\frac{Z_A + Z_B}{Z_L} + 1\right]$$

where the values of $U_A$, $I_A$ and $I_{FA}$ may be calculated from currents and voltages measured locally at the end point A according to Table 2. The line impedance $Z_L$ is a known parameter. $Z_A$ is the equivalent impedance of the network located behind the fault which may be known or, if not, may be calculated from measured currents and voltages (at the near end point A) before and after a fault. $Z_B$ is the equivalent impedance of the network located ahead of the fault and may be known or, if not, may be calculated or else estimated.

The real and imaginary parts of the complex factors $K_1$, $K_2$ and $K_3$ may be written as follows $$\begin{aligned} K_1 &= K_{1H} + j \times K_{1V} \\ K_2 &= K_{2H} + j \times K_{2V} \\ K_3 &= K_{3H} + j \times K_{3V} \end{aligned} \quad (42)$$

By separating the complex equation (40) into real and imaginary parts, two equations are obtained, between which the unknown fault resistance $R_F$ can be eliminated. This gives the following real, immediately solvable quadratic equation with n as a variable:

$$n^2 + B \times n + C = 0 \quad (43)$$

where $$B = \frac{K_{1V} \times K_{3H} - K_{1H} \times K_{3V}}{K_{3V}} \text{ and}$$

$$C = \frac{K_{2H} \times K_{3V} - K_{2V} \times K_{3H}}{K_{3V}}$$

When solving equation (43), two roots are obtained $$\begin{aligned} n_1 &= \frac{-B + \sqrt{B^2 - 4C}}{2} \\ n_2 &= \frac{-B - \sqrt{B^2 - 4C}}{2} \end{aligned} \quad (44)$$

of which that root is selected which fulfils the condition $0 \leq n \leq 1$.

Figure 7:
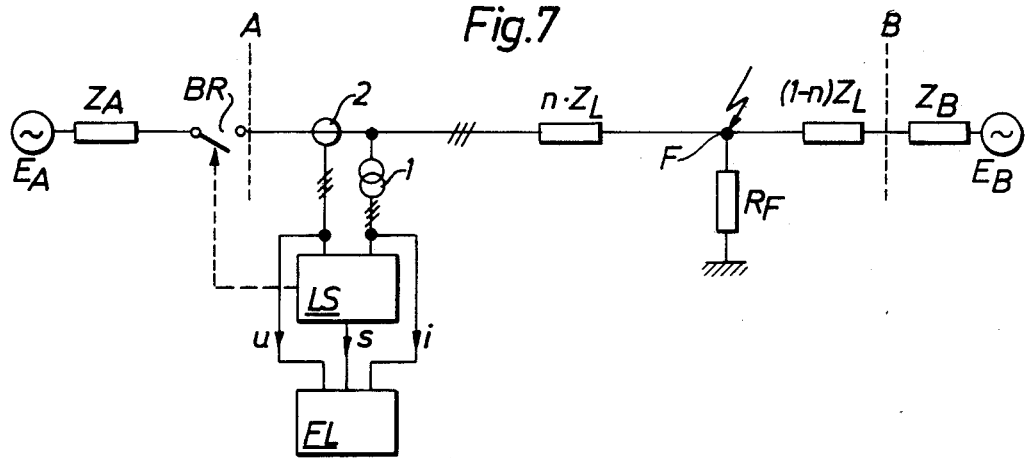
FIG. 7 shows one example of the connection of a fault locator according to this invention to an existing line protection device.

FIG. 7 shows an example of how a fault locator FL according to the invention may be connected to a line section A–B via a line protection device LS. This may, for example, consist of a line protection device of the type described in ASEA's "RAZFE Application Guide No. 61-12 AG". This device and the fault locator are supplied with measured values of the phase currents and phase voltages via voltage and current transformers 1 and 2, respectively. In the case of a fault appearing within the section A–B, the line protection device LS delivers a signal s to the fault locator FL. On the one hand this signal triggers the start of the calculation, by the fault locator FL, of the distance to the fault, and on the other hand the signal s contains information about the type of fault, stated in Table 2, that has arisen. As will be clear from the preceding account of the calculation procedure, the fault types decide which quantities are to be used when solving the fault equation.

Where necessary, the line protection device LS also supplies a tripping signal to a circuit breaker BR.

The fault locator FL may be combined with any type of line protection device which has phase-selective starting contacts.

Alternatively, the fault locator FL may be provided with circuits of its own for start-up and determination of the type of fault and can then be connected directly to the line, as shown in FIG. 1.

Figure 8:
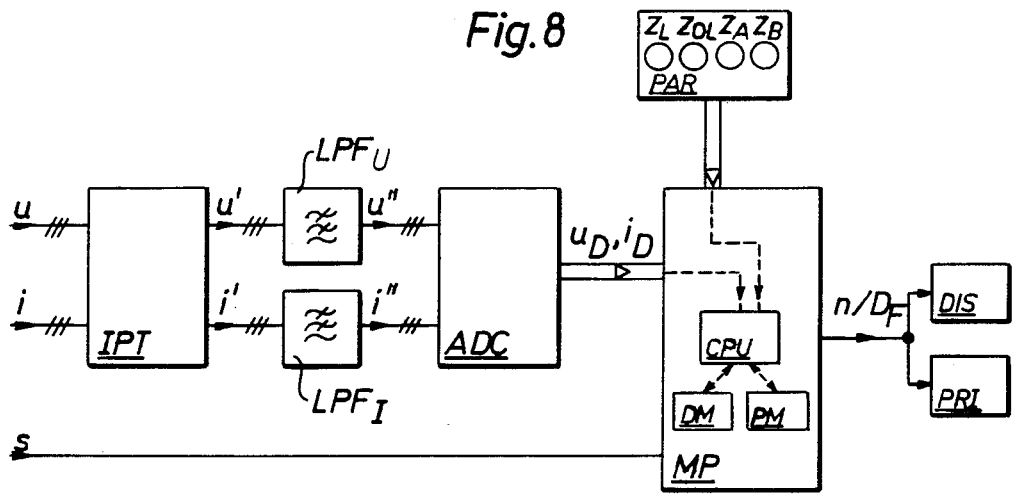
FIG. 8 is a block diagram of one embodiment of fault locator according to the invention.

FIG. 8 shows in schematic block diagram form one embodiment of a fault locator according to the invention. The measuring signals u and i, which consist of the three phase voltages and the three phase currents at the end point A, are supplied to a transformer unit IPT with shielded isolating transformers, which provide protection against transients and an adaptation of the signal level to the subsequent electronic unit. The output signals u' and i' from the transformer unit are filtered in respective voltage and current low-pass filters $LPF_U$ and $LPF_I$, operating for example at a limiting frequency 500 Hz. The filtered signals u'' and i'' are supplied to an analog/digital convertor ADC. In this, each of the input signals is sampled, for example 24 times each period. The measured values, in digital form ($u_D$, $i_D$), are supplied to a microprocessor MP. This includes a central unit CPU which carries out the following functions:
collection of measured values,
processing of measured values,
calculation of the fault distance,
outputting of result of the calculation, and
a return to normal measurement conditions after the line fault has been removed.

The microprocessor MP further comprises a data memory DM as well as a programming memory PM.

The fault locator shown in FIG. 8 further comprises parameter setting members PAR for setting the complex values of the line parameters (e.g. $Z_L$, $Z_{0L}$, $Z_A$ and $Z_B$). Finally there is a presentation unit DIS, for example a light-emitting diode display and a printer PRI.

The mode of operation of the fault locator can be described with reference to FIG. 9. The block DATA COLL. designates the collection of measured values. This proceeds continually during undisturbed operation. The digital measured values obtained from the A/D convertor are stored continuously in the data memory DM in such a way that this memory always contains the measured values of, for example, the last six periods. As already stated, this storage of data goes on continually during undisturbed operation of the network system but is interrupted within some period after receiving the start signal s from the line protection device due to a fault arising. The measured values, immediately before and during the initial appearance of the fault, are thus stored in the data memory DM.

When a fault arises, the fault locator also senses the contact position of the phase-selective start relays of the line protection device, so that the type of fault arising is defined.

When the collection of the measured values has been interrupted, a digital filtering (DIG. FILT.) is performed of those of the stored measuring signals which (see Table 2) are to be used when determining the distance. The filtering of a measuring signal is carried out in such a way that the vector quantities of the fundamental operating frequency components are extracted from the measuring signal. The digital filtering can be carried out in the manner described in "IEEE Tutorial Course 79 EH01487-PWR, Chapter III (pp. 16–23)".

After this filtering, the microprocessor MP sets the complex values of actual measured values and parameters and, in the manner described above, determines the constants B and C in equation (43), which is thereafter solved with the aid of a simple square root method (the block SOLVE EQ.). The value of the fault distance thus obtained is thereafter fed out (OUT RESULT) to the display member DIS and possibly also the printer PRI.

FIG. 10 shows the flow diagram for the program which controls the operation of the fault locator in the case of a line fault. First the type of fault is determined (FT?), on the basis of the information from the line protection device, and is stored in the data memory DM. This is symbolically shown as DMPG (single-phase fault PG) and DMPP (multi phase fault PP), respectively. With the aid of the information about the type of fault, the stored values of the measuring signals, necessary for the type of fault in question, are thereafter read according to what is indicated in the blocks DATA COLL. PP and DATA COLL. PG, respectively. Thereafter, these measuring signals are filtered (DIG. FILT.) in the manner described above. The preset estimated or calculated values of the network parameters are thereafter read (PARAM.). The constants $K_1$, $K_2$ and $K_3$ are calculated from equation (41) and thereafter the constants B and C in equation (43) are calculated. After this, the relative fault distance n is determined from this equation (see equation 44), and after the logical decision described with reference to equation (44), that value of n is obtained which is fed out to the presentation members etc. (OUT RESULT).

After this—possibly after manual resetting—the fault locator returns to the continual data collection and awaits the next fault, on the occurrence of which (NEXT FAULT) the operating cycle described above is repeated.

As will be clear from the foregoing description of the invention, it entails considerable advantages over prior art methods and devices.

The zero sequence components occurring in the case of a ground fault are eliminated according to the invention, and during the calculation only the positive sequence components are used. The zero sequence components cannot be deduced with any great reliability, and by using only the better-defined positive sequence components the accuracy in detecting the location of a fault is considerably increased.

Further, according to the invention all signal distortions in the fundamental frequency component in the measured values are eliminated, whereby errors in determining the distance, caused by d.c. components and harmonics, are completely eliminated.

Further, according to the invention, a complete network model is used, where in a correct manner the input ($I_B$) from the network beyond the remote end point B ($E_B$, $Z_B$) is taken into consideration. It has proved that this is of the greatest importance to be able to carry out—under all circumstances—a fault location in a fast and reliable manner and to obtain high accuracy in determining the fault distance.

For many operating cases, it is of great importance for the fault location to be effected rapidly. As described previously, the fault distance is obtained in a simple manner, according to the invention, by determining the constants from the measured values in a quadratic equation, whereafter the equation is solved by means of a simple square root method. This direct method offers (with the corresponding calculating capacity) a considerably more rapid distance determination than the previously known iterative methods. The method and device according to the present invention further provide—with one and the same calculation method—a correct and accurate distance determination for all types of faults that may occur on a three-phase line.

Since the direct method of solution according to the invention requires considerably lower calculating capacity than an iterative method (with the corresponding performance), a device according to the invention will be considerably simpler and cheaper than an iterative fault locator operating with corresponding speed.

The specific method and devices described above are subject to modification in a variety of ways and all such modifications within the scope of the following claims are within the ambit of this invention.

TABLE 1

| | DESIGNATIONS |
|---|---|
| $E_A$ | The EMF of the network lying behind the section (near end) |
| $E_B$ | The EMF of the network lying ahead of the section (remote end) |
| $U_A$ | General designation for voltage at point A |
| $U_B$ | General designation for voltage at point B |
| $I_A$ | General designation for current at point A |
| $I_B$ | General designation for current at point B |
| $U_{RA}$, $U_{SA}$, $U_{TA}$ | Phase voltages at point A |
| $U_{RB}$, $U_{SB}$, $U_{TB}$ | Phase voltages at point B |
| $I_{RA}$, $I_{SA}$, $I_{TA}$ | Phase currents at point A |
| $I_{RB}$, $I_{SB}$, $I_{TB}$ | Phase currents at point B |
| $I_{NA}$, $I_{NB}$ | Neutral currents at points A and B |
| $U_{RSA}$, $U_{STA}$, $U_{TRA}$ | Difference of phase voltages at point A ($U_{RSA} = U_{RA} - U_{SA}$) |
| $U_{RSB}$, $U_{STB}$, $U_{TRB}$ | Difference of phase voltages at point B |
| $I_{RSA}$ | Difference current between phases R and S at point A ($I_{RSA} = I_{RA} - I_{SA}$) |
| $I_{RSB}$ | Difference current between phases R and S at point B ($I_{RSB} = I_{RB} - I_{SB}$) |
| $U_{RA}{}^o$, $I_{RA}{}^o$, $I_{SA}{}^o$, $I_{TA}{}^o$ | Measured quantities prior to a fault |
| $U_k$ | Voltage drop between point A and the fault point F |
| $\Delta I_{RA}$ | Change in current of phase R due to a fault ($\Delta I_{RA} = I_{RA} - I_{RA}{}^o$) |
| $I_{1A}$, $I_{2A}$, $I_{0A}$ | Positive sequence, negative sequence and zero sequence currents at point A |
| $I_{1B}$, $I_{2B}$, $I_{0B}$ | Positive sequence, negative sequence and zero sequence currents at point B |
| $I_b$ | Measured load current prior to a fault ($I_b = I_{RA}{}^o$) |
| $E_F$ | Voltage at the fault point prior to a fault $\left(E_F = \dfrac{E_A - E_B}{Z_{1L} + Z_{1A} + Z_{1B}} \cdot (Z_{1A} + n \times Z_{1L})\right)$ |
| $U_F$ | Voltage at the fault point |
| $I_F$ | Current at the fault point |
| $I_f$ | Current at the fault point when calculating with |

TABLE 1-continued
DESIGNATIONS symmetrical components $\left(I_f = \dfrac{I_F}{3}\right)$

| | |
|---|---|
| $I_{FA}$ | Current change at point A due to the fault ($I_{FA} = D_{1A} \times I_F$) |
| $Z_A$ | Source impedance of network lying behind the section (near end) |
| $Z_B$ | Source impedance of network lying ahead of the section (remote end) |
| $Z_{1L}, Z_{2L}, Z_{0L}$ | Positive sequence, negative sequence and zero sequence impedance of the line ($Z_L = Z_{1L} = Z_{2L}$) |
| $Z_L$ | The impedance of the line section |
| $Z_{1A}, Z_{2A}, Z_{0A}$ | Positive sequence, negative sequence and zero sequence components of $Z_A$ ($Z_A = Z_{1A} = Z_{2A}$) |
| $Z_{1B}, Z_{2B}, Z_{0B}$ | Positive sequence, negative sequence and zero sequence components of $Z_B$ ($Z_B = Z_{1B} = Z_{2B}$) |
| $D_{1A}, D_{2A}, D_{0A}, D_{1B}, D_{2B}, D_{0B}$ | Distribution factors for the positive sequence, negative sequence and zero sequence networks at point A and point B, respectively |
| KNL | Zero sequence compensation $\left(KNL = \dfrac{Z_{0L} - Z_L}{3\,Z_L}\right)$ |
| $R_F$ | Fault resistance |
| DL | Length of line section |
| DF | Distance point A — fault point |
| n | Relative distance to fault $\left(n = \dfrac{DF}{DL}\right)$ |
| $a, a^2$ | $a = -\tfrac{1}{2} + j\dfrac{\sqrt{3}}{2}$ $\quad$ $a^2 = -\tfrac{1}{2} - j\dfrac{\sqrt{3}}{2}$ |
| $K_1, K_2, K_3$ | Complex factors in the equation $n^2 - n \times K_1 + K_2 - K_3 \times R_F = 0$ |
| $K_{1H}$ | Real part of $K_1$ |
| $K_{1V}$ | Imaginary part of $K_1$ |
| B, C | Constants in the equation $n^2 - Bn + C = 0$ |

TABLE 2
Values of $U_A$, $I_A$, $I_{FA}$ used for different types of fault

| Type of fault | $U_A$ | $I_A$ | $I_{FA}$ |
|---|---|---|---|
| RN | $U_{RA}$ | $I_{RA} + KNL \times I_{NA}$ | $\tfrac{1}{2}[3(I_{RA} - I_{RA}{}^o) - I_{NA}]$ |
| SN | $U_{SA}$ | $I_{SA} + KNL \times I_{NA}$ | $\tfrac{1}{2}[3(I_{SA} - I_{SA}{}^o) - I_{NA}]$ |
| TN | $U_{TA}$ | $I_{TA} + KNL \times I_{NA}$ | $\tfrac{1}{2}[3(I_{TA} - I_{TA}{}^o) - I_{NA}]$ |
| RST RS RSN | $U_{RA} - U_{SA}$ | $I_{RA} - I_{SA}$ | $(I_{RA} - I_{RA}{}^o) - (I_{SA} - I_{SA}{}^o)$ |
| ST STN | $U_{SA} - U_{TA}$ | $I_{SA} - I_{TA}$ | $(I_{SA} - I_{SA}{}^o) - (I_{TA} - I_{TA}{}^o)$ |
| TR TRN | $U_{TA} - U_{RA}$ | $I_{TA} - I_{RA}$ | $(I_{TA} - I_{TA}{}^o) - (I_{RA} - I_{RA}{}^o)$ |

What is claimed is:

1. A method for locating a fault point within a section of a three-phase power transmission line located between a network positioned behind the said section and a network positioned ahead of the said section, wherein currents and voltages in the line, are measured at a measuring point arranged at one end of the said section and the distance between the measuring point and the fault point is computed with the aid of the measured values and the parameters of the said section, characterized in that the type of the fault is determined,
the fundamental frequency components of the measured values are determined, and
on the basis of the type of fault and the complex values of the fundamental frequency components of the measured values and using a network model, which includes the influence of the infeed from the line ahead of said section, utilizing the impedance of the said section as well as values for the source impedances of the networks lying ahead of and behind the said section, eliminating possible zero sequence components in the fault current and using only positive sequence components and eliminating the influence of the fault resistance, the fault distance (n) related to the distance between the fault and the measuring point is determined as the solution of an equation $$n^2 + B \times n + C = 0$$

which contains the fault distance (n) as a variable, the parameters (B, C) of which are dependent on the fundamental frequency components of the measured values and on the said impedances, and locating the fault based on the fault distance n and the measuring point.

2. A method according to claim 1, in which the fundamental frequency components of the measured values are formed as complex quantities by digital filtering of the measured values.

3. A method according to claim 1, in which the equation is solved by means of a direct, non-iterative method.

4. A method according to claim 2, in which the equation is solved by means of a direct, non-iterative method.

5. A device for locating a fault within a section of a three phase power transmission line which section is located between a network positioned behind said section and a network positioned ahead of said section, the device comprises calculating members and a display arranged to calculate, on the basis of current and voltage values measured at a measuring point located adjacent to one end of the said section and of the known impedance of the section, the distance (n) between said measuring point and said fault and provide a display of said distance (n), characterized in that said device comprises
members for filtering the measured values and determining their fundamental frequency components as complex quantities,
calculating members arranged to determine, on the basis of information about the type of fault in question and of the complex quantities of the measured values and using a network model, which includes the influence of the infeed from the line ahead of said section, utilizing the impedance of the said section as well as the values of the source impedances of the networks located ahead of and behind, respectively, eliminating possible zero sequence components in the fault current and using only positive sequence components and eliminating the influence of the fault resistance, the fault distance as the solution of an equation $$n^2 + B \times n + C = 0.$$

which contains the fault distance (n) as a variable, the parameters (B, C) of which are dependent on said fundamental frequency components and said impedances, and means for displaying a representation of said distance (n).

6. A device according to claim 5, which further comprises members for pre-setting the complex values of the impedance of the said section.

7. A device as claimed in claim 6, in which members are also provided for pre-setting the impedances of the networks located ahead of and behind the said section.

8. A device according to claim 5, in which the calculating member includes means to determine, from the said equation, the fault distance (n) with the aid of a square root method.

* * * * *